United States Patent [19]
Amano

[11] Patent Number: 5,761,061
[45] Date of Patent: Jun. 2, 1998

[54] DATA PROCESSING MEDIUM, ITS BACKUP CIRCUIT, AND DATA PROCESSING SYSTEM

[75] Inventor: Kazutoshi Amano, Tokyo, Japan

[73] Assignee: Berg Technology, Inc., Reno, Nev.

[21] Appl. No.: 663,314

[22] PCT Filed: Dec. 13, 1994

[86] PCT No.: PCT/US94/14364
§ 371 Date: Aug. 16, 1996
§ 102(e) Date: Aug. 16, 1996

[87] PCT Pub. No.: WO95/16940
PCT Pub. Date: Jun. 22, 1995

[30] Foreign Application Priority Data
Dec. 17, 1993 [JP] Japan .................. 5-318053

[51] Int. Cl.$^6$ ........................................ G05B 9/02
[52] U.S. Cl. .................... 364/187; 307/65; 365/229
[58] Field of Search ........................ 364/187; 307/29, 307/39, 21, 23, 25, 64, 65, 66; 340/333; 365/229; 323/272, 271

[56] References Cited
U.S. PATENT DOCUMENTS

| | | | |
|---|---|---|---|
| 3,816,768 | 6/1974 | Stein | 307/296 |
| 3,982,141 | 9/1976 | Copeland, III | 307/296 |
| 4,492,876 | 1/1985 | Colbert et al. | 307/66 |
| 4,677,311 | 6/1987 | Morita | 307/66 |
| 5,033,882 | 7/1991 | Vanderpool et al. | 307/66 |
| 5,152,697 | 10/1992 | Abe et al. | 439/152 |

FOREIGN PATENT DOCUMENTS 0 437 129 A2  7/1991  European Pat. Off.
4026798 A1  2/1992  Germany

*Primary Examiner*—James P. Trammell
*Attorney, Agent, or Firm*—Woodcock Washburn Kurtz Mackiewicz & Norris LLP

[57] ABSTRACT

There is disclosed a backup circuit for a memory card where the stored data in an S-RAM is retained even when the card (2) contains a main battery (18) whose output voltage is 3.3 V, an auxiliary battery (20), and a charging prevention diode (22). The main battery (18) and the auxiliary battery (20) are connected in parallel. Between their junction (28) and a built-in power supply (8) of a personal computer (4), the charging prevention diode (22) is provided. Because the second diode (22) is placed in a forward direction running from the junction (28) toward a voltage supply line (10), the auxiliary battery (20) is charged only from the main battery (18), and a charging current from the built-in power supply (8) does not flow into the auxiliary battery (20).

19 Claims, 2 Drawing Sheets

5,761,061

1

DATA PROCESSING MEDIUM, ITS BACKUP CIRCUIT, AND DATA PROCESSING SYSTEM

FIELD OF THE INVENTION

This invention relates generally to a data processing medium. More particularly, this invention relates to a circuit for backing up the semiconductor element of a data processing medium in replacing the battery for the data processing medium, and to a data processing medium with the backup circuit. Additionally, this invention relates to a data processing system containing the data processing medium and a data processing unit.

BACKGROUND OF THE INVENTION

In general, a data processing medium such as a memory card is supplied with a driving voltage from a data processing unit (typically, a personal computer and its peripheral equipment) in which the medium is to be installed. When the supply of the voltage to a memory card using a static random access memory (hereinafter, abbreviated as an S-RAM) as the data storage element is cut off, the stored data will be lost.

Accordingly, to back up the stored data in the S-RAM of a memory card, various backup circuits and circuit systems have been proposed.

As one known example, there is a circuit in which the voltage supply line of a memory card is connected to a parallel combination of the main battery acting as a first backup means, an auxiliary battery acting as a second backup means (a large capacitor), and an S-RAM. In this circuit, while the memory card is being removed from the data processing unit, the main battery supplies a voltage to the S-RAM to retain the stored data in the S-RAM. When the main battery is replaced, the large capacitor supplies a voltage for retaining the stored data in the S-RAM.

Generally, when data is read from the S-RAM, a higher voltage than that of the main battery is supplied from an external power supply (a power supply build in the data processing unit) to the S-RAM through the voltage supply line. In the case of a circuit using a conventional large capacitor, the voltage from the external power supply is also supplied to the large capacitor. This permits a charging current to flow into the large capacitor at the same time that an operating current flows into the S-RAM.

The charging current to the large capacitor is a wasteful load to the external power supply. The large capacitor is required to have a high withstand voltage so as to withstand the voltage from the external power-supply line. Therefore, it is necessary to use a relatively expensive large capacitor for the conventional circuit.

As another known example, there is a circuit system in which the current line of the power supply for an IC card is connected to a parallel combination of the main battery acting as a first backup means, a rechargeable auxiliary battery (a lithium battery) acting as a second backup means, and an S-RAM, with a diode and a constant-voltage circuit connected between the power supply and the lithium battery. In this circuit system, the lithium battery backs up the S-RAM when the main battery is replaced.

In the conventional circuit system, however, the lithium battery is charged only when a high voltage for operating the S-RAM, for example, a +5 voltage is applied from the power supply. Therefore, before the replacement of the main battery, the lithium battery must be charged from the power supply. Furthermore, because the conventional circuit sys-

2 tem contains a constant-voltage source, its design and arrangement are complex.

Additionally, in the conventional circuit or circuit system, each time that the power supply applies a voltage to the S-RAM, the auxiliary battery (the large capacitor or lithium battery) is also charged. However, since the number of charges and discharges is limited for the large capacitor or lithium battery, frequent charging and discharging degrades its characteristics.

SUMMARY OF THE INVENTION

A general object of the present invention is to solve problems peculiar to the above-described conventional circuit and circuit system. Specifically, the object of the invention is to provide a data processing medium, its backup circuit, and a data processing system which prevent a charging current from flowing from an external power supply into a second backup means, allow use of a second backup means with low withstand voltage characteristics, require no charging of the second backup means before the replacement of a first backup means, and are able to reduce the number of charges and discharges of the second backup means.

According to one aspect of the present invention, there is provided a data processing medium containing a semiconductor element which can at least store data. This data processing medium comprises: a voltage input terminal which can be connected to an external power supply and from which a voltage supply line is extended to supply a voltage from the external power supply so as to operate a semiconductor element; first detachable backup means which has a positive and a negative electrode, the positive electrode being connected to the semiconductor element via the voltage supply line, and which backs up the stored data in the semiconductor element during the time when the external power supply is disconnected from the voltage input terminal; second backup means which has a positive and a negative electrode, the positive electrode being electrically connected in parallel to the positive electrode of the first backup means so as to be charged from the first backup means, and which backs up the stored data in the semiconductor element during the time when the external power supply is disconnected from the voltage input terminal and the first backup means is detached; and charging prevention means provided between the junction of the positive electrode of the first backup means and the positive electrode of the second backup means and the external power supply so that the second backup means may not be charged from the external power supply.

The data processing medium may be an integrated circuit card or a memory card. According to the embodiment of the invention, the semiconductor element may be a static random access memory.

The second backup means may be a capacitor or a rechargeable battery.

According to another aspect of the invention, there is provided a circuit for backing up the stored data in a semiconductor element in a data processing medium comprising a semiconductor element which can at lease store data and a voltage input terminal which can be connected to an external power supply and from which a voltage supply line is extended to supply a voltage from the external power supply so as to operate the semiconductor element.

According still another aspect of the invention, there is provided a data processing system comprising a data processing medium containing a semiconductor element which can at least store data and a data processing unit to which the data processing medium is to be connected, data exchange being effected between the data processing medium and the data processing unit.

According to the invention, because the positive electrodes of the first and second backup means are connected in parallel, the second backup means is constantly charged from the first backup means.

Because the charging prevention means is provided between the junction of the first backup means and the second backup means and the external power supply, the second backup means is not charged from the external power supply.

DETAILED DESCRIPTION OF THE PREFERRED EMBODIMENTS

Figure 1:
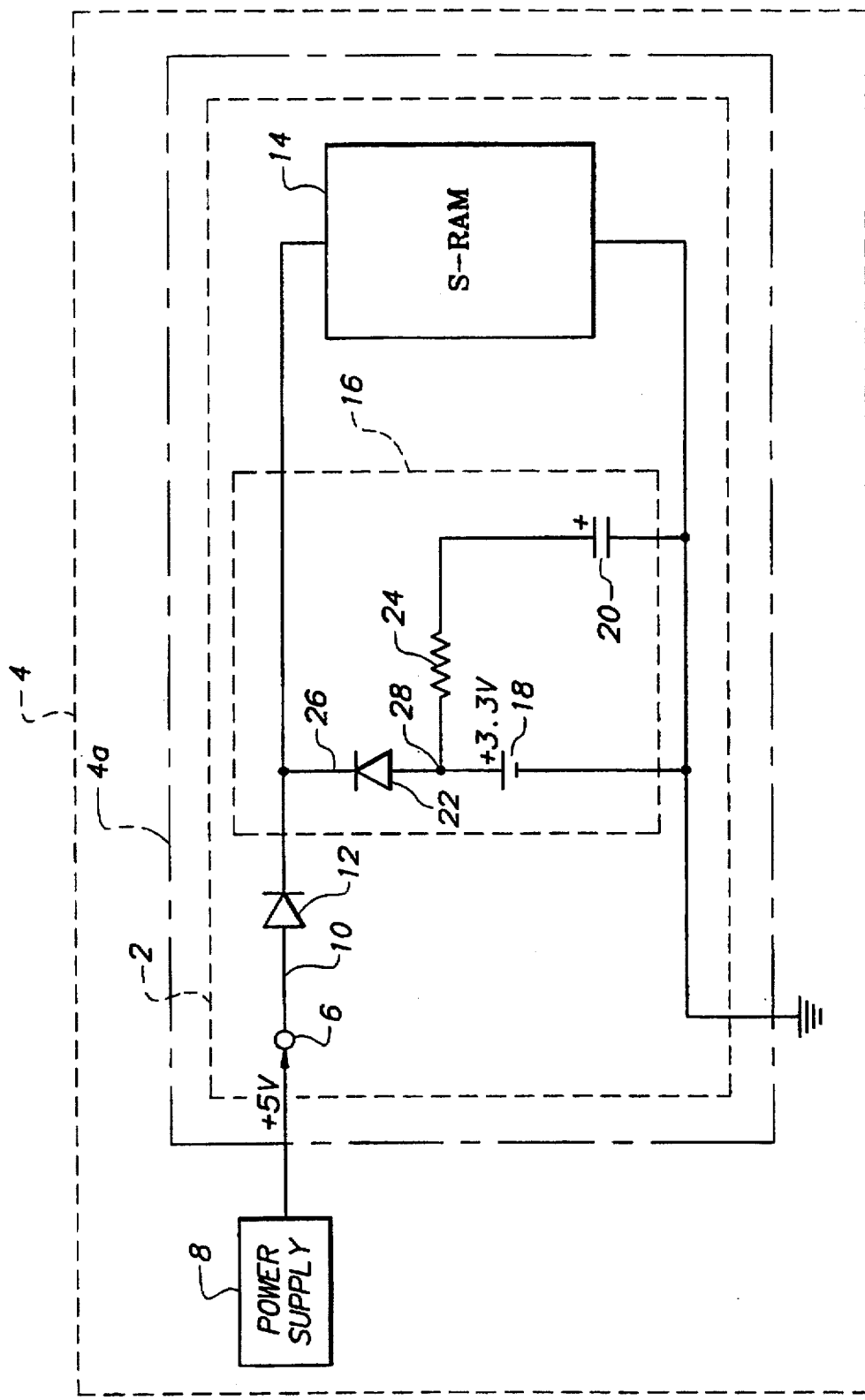
FIG. 1 is a circuit block diagram of a data processing system according to a first embodiment of the present invention

With reference to FIG. 1, in a data processing system of the present invention, data processing medium generally indicated by reference symbol 2 is a memory card to be installed in a data processing unit (e.g., a personal computer and its peripheral equipment) 4 for transmitting and receiving to and from the medium.

The memory card 2 is installed detachably in the data processing unit 4 via, for example, a connector 4a provided in the data processing unit 4. The connector 4a is electrically connected to a data transmission/reception system (not shown) of the data processing unit 4. It is desirable that the connector 4a should be a detachable type to the data processing unit 4. For example, the connector disclosed in Japanese Utility Model Application No. 2-90772 (the corresponding U.S. Pat. No. 5,152,697) can be used.

This invention relates chiefly to backing up the stored data in the memory card 2, so that a detailed explanation of the data transmission and reception system between the memory card 2 and the data processing unit 4 and of the connector 4a will be omitted. In FIG. 1, the dimensions of the memory card 2 are drawn exaggeratedly with respect to the general data processing unit 4.

FIG. 1 shows a state where the memory card 2 is installed properly in the data processing unit 4 via the connector 4a. In this state, the voltage input terminal 6 of the memory card 2 can be connected to an external power supply (a power supply built in the data processing unit 4) via the connector 4a. The external power supply 8 typically supplies a +5-V voltage to the input terminal 6 of the memory card 2. The voltage supply line 10 extended from the input terminal 6 of the memory card 2 is provided with a first diode 12 for preventing the battery current from flowing backward to the external power supply 8. The purpose of placing the diode 12 is to prevent the battery (explained later) in the card 2 from being consumed faster due to the backward flow of current from the battery (explained later 0 in the card 2 to the unit 4, because the voltage of the external power supply 8 drops to zero when the driving power supply of the data processing unit 4 is turned off while the memory card 2 remains in contact with the data processing unit 4.

The voltage supply line 10 in the downstream of the first diode 12 is connected to a parallel combination of a semiconductor element 14 and its backup circuit 16.

The semiconductor element 14 in the embodiment is a static random access memory (hereinafter, referred to as an S-RAM). The power consumption of the S-RAM 14 is 5 v at the time of reading and writing. When the voltage input terminal 6 of the memory card 2 is not connected to the external power supply 8, that is, when the memory card 2 is not connected to the data processing unit 4, the power consumption of the S-RAM 14 is required to be 2 V or more in order to back up the stored data. The ordinary S-RAM 14 can be backed up at voltages ranging from 2 V to 5.5 V.

The backup circuit 16 contains a main battery 18, an auxiliary battery 20, and a second diode 22.

The main battery 18 is a commercially available coin-type lithium battery of the CR2025 type, whose nominal output voltage is 3 V (actually, 3.3 V). For the auxiliary battery 20, a rechargeable battery or a capacitor may be used. In the present embodiment, a 0.1-F polyacelene capacitor is used.

The positive electrode of the main battery 18 and that of the auxiliary battery 20 are connected in parallel directly or via a resistor 24. When the resistor 24 is used, the resistance is preferably 1 KΩ or less. The reason for this will be explained later.

The second diode 22 is provided in a line 26 running from the voltage supply line 10 to the junction 28 of the main battery 18 and the auxiliary battery 20. Since the second diode 22 is placed in a forward direction running from the junction 28 toward the voltage supply line 10, the auxiliary battery 20 is charged only from the main battery 18, thereby preventing a charging current from flowing into the auxiliary battery 20 from the external battery 8.

Therefore, the withstand voltage of the auxiliary battery 20 has only to be nearly the maximum output voltage (in the embodiment, 3.3 V) of the main battery 18. It is not necessary to take into account the withstand voltage of the auxiliary battery 20 with respect to the output voltage (in the embodiment, 5 V) of the external battery 8. The second diode 22 is placed to prevent the main battery 18 from being charged. In the present embodiment, placing the diode 22 enables the number of charges and discharges of the auxiliary battery 20 to be reduced, thereby extending the service life of the auxiliary battery 20 and also enabling use of a low withstand voltage auxiliary battery 20.

The negative electrodes of the semiconductor element 14, main battery 18, and auxiliary battery 20 are each connected to a ground line 30.

The reason why it is desirable that the resistance of the resistor 24 should be 1 kΩ or less will be described below.

The resistance of the resistor 24 is 1 kΩ. With the auxiliary battery 20 fully discharged (consequently the output voltage is 0 V), when a new main battery 18 whose output voltage is 3.3 V is installed, a maximum current of 3.3 mA (=3.3 V/1 KΩ) will flow in the transition period at the beginning of charging. A current on this order is not a heavy load to the new main battery 18. At this time, a drop in the output voltage of the main battery 18 is approximately 0.2 v. The drop in the output voltage was measured with a 1-KΩ constant resistance load being connected to a coin-type lithium battery of the CR2025 type.

As the auxiliary 20 is charged more, the charging current reduces accordingly, with the result that the output voltage of the main battery 18 rises and restores the original condition. Therefore, even if the resistance is reduced, only momentary voltage drop will take place. Because the output voltage of the main battery 18 restores the original condition as the charging of the auxiliary battery 20 makes progress, there arises no serious function problem.

The commercially available coin-type lithium battery of the CR2025 type has a maximum discharging current of approximately 6 mA continuous and 50 mA in pulse form. When the lowest resistance of the resistor 24 is obtained from the current (50 mA) of the pulse load, it will give 600 Ω (=3 V/50 mA).

Because it is hard for current to flow into the auxiliary battery 20 when the resistance of the resistor 24 is too large, it takes time to charge the auxiliary battery 20. In replacing the main battery 18, because the backup current is also supplied to the S-RAM 14 via the resistor when the S-RAM 14 is backed up only by the auxiliary battery 20, the backup voltage of the S-RAM 14 will drop. For example, with the resistance of the resistor 24 being 10 KΩ, when a 10-μ A backup current flows, a 0.1-V voltage drop will take place due to the resistor 24. Since the output voltage of the main battery 18 is naturally low at the time of replacement of the main battery 18, the potential of the auxiliary battery 20 connected in parallel to the main battery 18 is also at the same level. Therefore, it is desirable that the output voltage of the auxiliary battery 20 should be used effectively at the time of replacement of the main battery 18 by minimizing a voltage drop due to the resistor 24. Accordingly, the lower the resistance of the resistor 24, the better. If the resistance of the resistor 24 is 1 kΩ, a voltage drop due to a backup current of 10 μ A is 10 mV, which is almost negligible.

Another purpose of placing the resistor 24 is to protect the main battery 18 if the auxiliary battery 20 should break down and be short-circuited. If the resistor 24 is not provided, an excessive current will flow from the main battery 18 in case the auxiliary battery 20 breaks down and goes short-circuited, permitting the main battery 18 to generate heat. In the worst case, the main battery 18 can explode. By placing he resistor 24, however, current in the main battery 18 can be limited to prevent the main battery 18 from generating heat and exploding.

The procedure for replacing the main battery 18 of the memory card 2 and the operation of the backup circuit will be described as follows.

(i) First, the memory card 2 is removed from the data processing unit 4. This disconnects the built-in power supply 8 of the data processing unit 4 from the memory card 2. In this case, because the main battery 18 supplies a 3-V voltage to the S-RAM 14, the stored data in the S-RAM 14 is retained.

(ii) Then, to replace the main battery 18, the main battery 18 is removed from the memory card 2. In this case, because the auxiliary battery 20 supplies a voltage to the S-RAM 14, the stored data in the S-RAM 14 is retained. Since the main battery 18 charges the auxiliary battery 20 even if the memory card 2 is removed from the data processing unit 4, it is not necessary to charge the auxiliary battery 20 each time the main battery 18 is replaced. In the present embodiment, even if the main battery 18 is removed from the memory card 2, the stored data in the S-RAM 14 is retained for nearly 10 minutes by the auxiliary battery 20.

(iii) By providing a new main battery 18 on the memory card 2, a voltage is supplied again from the main battery 18 to the S-RAM 14.

(iv) The memory card 2 whose main battery 18 is replaced with a new one is installed in the data processing unit 4.

As described above, even in the course of replacing the main battery 18, the stored data in the S-RAM 14 is retained and the output voltage of the external power supply 8 is not applied to the auxiliary battery 20.

Furthermore, the circuit configuration is simple. As compared with a conventional backup circuit, the number of component parts is not increased much. Because in a conventional backup circuit, a lithium battery or the like which cannot (must not) be charged as the main battery cannot is generally used, a diode never fails to be added in a circuit using such a main battery, regardless of whether the auxiliary battery 20 is present or not. Therefore, the number of component parts does not increase in the conventional backup circuit as a result from adding a second diode 22, as in the present invention.

Figure 2:
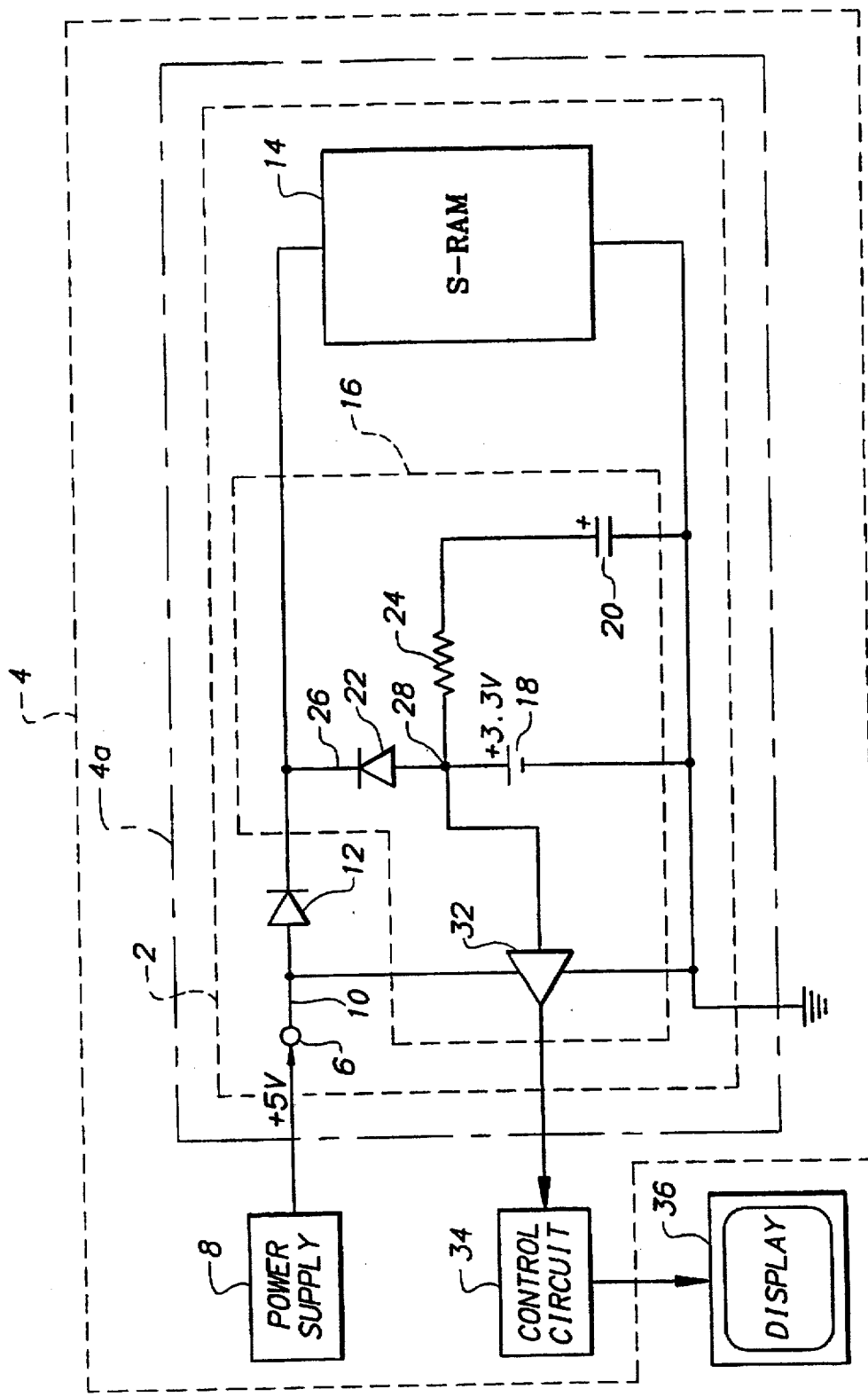
FIG. 2 is a circuit block diagram of a second embodiment of the invention

FIG. 2 shows a second embodiment of the present invention. The second embodiment differs from the first embodiment in that the former is provided with means for letting the operator know a drop in the output voltage of the main battery 18 of the memory card 2.

In FIG. 2, the backup circuit 16 of the memory card 2 contains a comparator 32 differently from the first embodiment. The comparator 32 in the present embodiment is a comparator 32 containing a reference voltage generating circuit. The comparator 32 has an input terminal, to which the output voltage (normally 3 V) of the main battery 18 is supplied as an input voltage. The reference voltage generating circuit built in the comparator 32 generates a reference voltage (normally 2.3 V) to be compared with the output voltage of the main battery 18. The comparator 32 outputs an alarm signal (digital signal) when the input voltage drops below the reference voltage. The alarm signal is inputted to a control circuit 34 of the data processing unit 4. The control circuit 34, on the basis of the alarm signal, displays a message that the main battery 18 is consumed, on a display 36 provided for the data processing unit 4.

Alternatively, the comparator 32 may be provided for the data processing unit 4. In this case, the comparator 32 may be of a type which directly senses the output voltage (analog signal) of the main battery 18. Furthermore, in this case, the output voltage of the external power supply 8 is not necessarily used as a reference voltage.

The present invention is not limited to the above embodiments. It will be obvious to those skilled in the art that the invention may be practiced or embodied in still other ways without departing from the spirit or essential character thereof. For instance, by using the output of the comparator 32 to drive acoustic and/or optical and/or visual alarm means such as a buzzer or a lamp, in addition to the display 36, it is possible to let the operator know a drop in the output voltage of the main battery 18.

The data processing medium 2 to which the present invention is to be applied contains various types of IC (integrated circuit) cards on which semiconductor storage elements requiring constant voltage supply for retaining data are provided, in addition to a memory card.

As has been explained, according to the data processing medium of the invention and its backup circuit and the data processing system of the invention, because the second backup means is charged by the first backup means, it is not necessary to charge the second backup means before replacement of the first backup means, thereby reducing the number of charges and discharges of the second backup means. Because a charging current does not flow from the external power supply to the second backup means, the second backup means may be one with low withstand voltage characteristics and consequently be an inexpensive one. Furthermore, the configuration of the backup circuit is simple.

What is claimed is:

1. A data processing medium containing a semiconductor element which can at least store data, comprising:

a voltage input terminal which can be connected to an external power supply and from which a voltage supply line is extended to supply a voltage from the external power supply so as to operate the semiconductor element;

first detachable backup means which has positive and a negative electrode, the positive electrode being operatively coupled to the semiconductor element via the voltage supply line, and which backs up the stored data in the semiconductor element during the time when the external power supply is disconnected from the voltage input terminal;

second backup means which has a positive and a negative electrode, the positive electrode being electrically connected to the positive electrode of the first backup means so as to be charged from the first backup means, and which backs up the stored data in the semiconductor element during the time when the external power supply is disconnected from the voltage input terminal and the first backup means is detached; and charging prevention means provided between the junction of the positive electrode of the first backup means and the positive electrode of the second backup means and the external power supply so that the second backup means may not be charged from the external power supply.

2. The data processing medium according to claim 1, wherein said data processing medium is an integrated circuit card.

3. The data processing medium according to claim 1 or 2, wherein said data processing medium is a memory card.

4. The data processing medium according to claim 1, wherein said semiconductor element is a static random access memory.

5. The data processing medium according to claim 1, wherein said second backup means is a capacitor.

6. The data processing medium according to claim 1, wherein said second backup means is a rechargeable battery.

7. A backup circuit for backing up stored data in a semiconductor element in a data processing medium comprising a semiconductor element which can at least store data and a voltage input terminal which can be connected to an external power supply and from which a voltage supply line is extended to supply a voltage from the external power supply so as to operate the semiconductor element, said backup circuit comprising:

first backup means which is detachable from the data processing medium, has a positive and a negative electrode, the positive electrode being electrically connected to the semiconductor element via the voltage supply line, and which backs up the stored data in the semiconductor element during the time when the external power supply is disconnected from the voltage input terminal;

second backup means which is detachable from the data processing medium, has a positive and a negative electrode, the positive electrode being electrically connected to the positive electrode of the first backup means so as to be charged from the first backup means, and which backs up the stored data in the semiconductor element during the time when the external power supply is disconnected from the voltage input terminal and the first backup means is detached from the data processing medium; and charging prevention means provided between the junction of the positive electrode of the first backup means and the positive electrode of the second backup means and the external power supply so that the second backup means may not be charged from the external power supply.

8. The backup circuit according to claim 7, wherein the positive electrode of said first and the positive electrode of said second backup means are connected in parallel directly.

9. The backup circuit according to claim 7, wherein the positive electrode of said first backup means and the positive electrode are connected in parallel via a resistance.

10. The backup circuit according to any one of claims 7 to 9, wherein said second backup means is a capacitor.

11. The backup circuit according to any one of claims 7 to 9, wherein said second backup means is a rechargeable battery.

12. The backup circuit according to claim 7, wherein said charging prevention means is a diode provided in a forward direction running from the positive electrode of the first backup means toward said power supply line.

13. A data processing system comprising a data processing medium containing a semiconductor element which can at least store data and a data processing unit to which the data processing medium is to be connected, data exchange being effected between the data processing medium and the data processing unit, wherein said data processing unit comprises:

a power supply for supplying a voltage; and transmission/reception means for transmitting and/or receiving data to and from said semiconductor element of said data processing medium; and said data processing medium comprises:

a voltage input terminal which can be connected to said power supply of said data processing unit and from which a voltage supply line is extended to supply a voltage from said power supply so as to operate said semiconductor element;

first detachable backup means which has a positive and a negative electrode, the positive electrode being connected to said semiconductor element via the voltage supply line, and which backs up the stored data in said semiconductor element during the time when said power supply is disconnected from the voltage input terminal;

second backup means which has a positive and a negative electrode, the positive electrode being electrically connected in parallel to the positive electrode of the first backup means so as to be charged from the first backup means, and which backs up the stored data in said semiconductor element during the time when said power supply is disconnected from the voltage input terminal and the first backup means is detached; and charging prevention means provided between the junction of the positive electrode of the first backup means and the positive electrode of the second backup means and the voltage input terminal so that the second backup means may not be charged from said power supply.

14. The data processing system according to claim 13, further comprising connection means for connecting said data processing medium and said data processing unit so that data may be transmitted and/or received between said semiconductor element of said data processing medium and said transmission/reception means of said data processing unit.

15. The data processing system according to claim 13 or 14, wherein sad connection means is a connector which is installed in said data processing unit and into which said data processing medium can be installed.

16. The data processing system according to any one of claims 13 to 14, further comprising means for letting the operator know the consumption of the first backup means of said data processing medium.

17. The data processing system according to claim 13, wherein said data processing medium is an integrated circuit card.

18. The data processing system according to claim 13, wherein said data processing medium is a memory card.

19. The data processing system according to claim 13, wherein said data processing unit is a computer and/or its peripheral equipment.

* * * * *